(12) United States Patent
Zhang et al.

(10) Patent No.: US 10,192,861 B1
(45) Date of Patent: Jan. 29, 2019

(54) OPC METHOD FOR A SHALLOW ION IMPLANTING LAYER

(71) Applicant: Shanghai Huali Microelectronics Corporation, Shanghai (CN)

(72) Inventors: Yueyu Zhang, Shanghai (CN); Meng Kang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/800,081

(22) Filed: Nov. 1, 2017

(30) Foreign Application Priority Data

Jul. 31, 2017 (CN) .......................... 2017 1 0636973

(51) Int. Cl.
    *G06F 17/50* (2006.01)
    *H01L 27/02* (2006.01)

(52) U.S. Cl.
    CPC ........ *H01L 27/0207* (2013.01); *G06F 17/505* (2013.01); *G06F 17/5081* (2013.01)

(58) Field of Classification Search
    CPC ........................... G06F 17/505; G06F 17/5081
    USPC .......................................................... 716/53
    See application file for complete search history.

(56) References Cited

U.S. PATENT DOCUMENTS

| | | | | |
|---|---|---|---|---|
| 9,153,689 | B2* | 10/2015 | Maly | H01L 27/1203 |
| 2007/0120156 | A1* | 5/2007 | Liu | H01L 27/0207 257/288 |
| 2007/0128782 | A1* | 6/2007 | Liu | H01L 27/0207 438/187 |
| 2018/0151614 | A1* | 5/2018 | Endo | H01L 27/14614 |

\* cited by examiner

*Primary Examiner* — Suchin Parihar
(74) *Attorney, Agent, or Firm* — Tianchen LLC

(57) ABSTRACT

The present invention discloses an OPC method for a shallow ion implanting layer, comprising the following steps of: selecting a valid device region in an implanting active region in a shallow ion implanting original layout; selecting a region in the valid device region which is contacted with a poly-silicon pattern in a poly-silicon layer, as a poly-silicon contacting region; extending the length and width of the poly-silicon contacting region and the non poly-silicon contacting region, to form a new poly-silicon contacting region and a new non poly-silicon contacting region; combining a gap portion which an interval between any two new poly-silicon contacting regions and/or new non poly-silicon contacting regions after extending is smaller than or equal to G and completely fallen in the STI region, with the poly-silicon contacting regions and non poly-silicon contacting regions after extending, to form a correction target layer; performing a model-based OPC routine on the correction target layer, to obtain a mask layer.

10 Claims, 7 Drawing Sheets

OPC METHOD FOR A SHALLOW ION IMPLANTING LAYER

CROSS-REFERENCE TO RELATED APPLICATION

This application claims the priority benefit of China application serial no. 201710636973.8, filed Jul. 31, 2017. All disclosure of the China application is incorporated herein by reference.

FIELD OF THE INVENTION

The present invention relates to a microelectronic and semiconductor fabrication field, more particularly to an OPC method for a shallow ion implanting layer.

BACKGROUND OF THE INVENTION

As the development of the semiconductor fabrication technology tends to downsize the node, the layout pattern of the shallow ion implanting layer becomes smaller and smaller in size, and the pattern boundary becomes closer to the device in distance. However, it is easily to occur distortion for the pattern size due to the influence of the reflected light from the different material and morphology in a front layer of the bottom portion, which causes the reduction of the photoresist size, error implantation of ion into a device of photoresist covering region, or directly results in the stripping of the photoresist, to cause the failure of the ion implantation and become the yield killer. In particular, when an interval between patterns is smaller than 1.5~3 times of the minimum size, there is a high possibility of forming hot spot, and it is easy to cause adverse effects such as photoresist collapse or inverse glue since the photoresist becomes narrow due to shrinkage after the subsequent exposure.

To solve the above problems, it is common action in the prior art to perform an Optical Proximity Correction (OPC) routine on the lithograph pattern according to wafer data, but there are defects in three aspects for the conventional Optical Proximity Correction:

(1) since the layout pattern is complicated and the influence of the reflect from the front layer is changeable, the amount of the collected wafer data is huge, which results in that it is very difficult to use the method of the Optical Proximity Correction to compensate and as a result, and there are still some potential problems to be leaved.

(2) Since the layout pattern of the shallow ion implanting layer are mostly generated by the logical operation, there are many useless pattern structures fallen on STI, and these pattern structures will not only increase the difficulty of the OPC routine and the operation amount, but also is the source which brings the process problems.

(3) Although these patterns fallen outside the shallow ion implanting region of a device are invalid, other special processing is not made on these patterns when layout design or logical operation is performed, only if they are in conformity with the design rules and requirement of the ion implantation of the device. That is, there are many invalid pattern structures to be remained. However, the correction on these invalid pattern structures will cause the waste of calculation resource of OPC, prolong the whole correction procedure, and thus affect the periods of the semiconductor process development.

SUMMARY OF THE INVENTION

The technical problem to be solved by the present invention is to provide an OPC method for a shallow ion implanting layer, which can quickly and effectively eliminate the invalid pattern region of the shallow ion implanting layer, remain the necessary pattern of the shallow ion implanting region, simplify the difficulty of the pattern OPC processing, and save the operation time, meanwhile the risk of causing the process problem due to the invalid pattern can be reduced.

To achieve the above objects, the present invention adopts the following solution: an OPC method for a shallow ion implanting layer, providing a shallow ion implanting original layout and other layers corresponding to the shallow ion implanting original layout include an active area layer, a contact hole layer and a poly-silicon layer, wherein the active area layer includes an active region pattern, the contact hole layer includes a contact hole pattern and the poly-silicon layer includes a ploy-silicon pattern; wherein the method comprising the following steps of:

S01: selecting a valid device region in an implanting active region of the shallow ion implanting original layout; wherein a portion other than an active region pattern in an active area layer is a STI region, the shallow ion implanting original layout includes a shallow ion implanting region and a non-shallow ion implanting region, and a portion overlapped between the shallow ion implanting region and the active region pattern in the active area layer is the implanting active region; a portion to remain the implanting active region which touches to the contact hole pattern in the contact hole layer is a valid device region, and anther portion to remain the implanting active region which does not touch to the contact hole pattern in the contact hole layer is a non-device invalid region;

S02: selecting a region in the valid device region which is contacted with a poly-silicon pattern in a poly-silicon layer, as a poly-silicon contacting region, and selecting a region in the valid device region which is not contacted with the poly-silicon pattern in the poly-silicon layer, as a non poly-silicon contacting region;

S03: extending the length and width of the poly-silicon contacting region and the non poly-silicon contacting region, to form a new poly-silicon contacting region and a new non poly-silicon contacting region; wherein the new poly-silicon contacting region and the new non poly-silicon contacting region are located in any region except the active region pattern touching with the contact hole pattern in the non-shallow ion implanting region;

S04: combining one gap portion or more gap portions which an interval between any two new poly-silicon contacting regions and/or new non poly-silicon contacting regions after extending is smaller than or equal to with the poly-silicon contacting regions and the non poly-silicon contacting regions after extending, to form a correction target layer, wherein G is an interval safe value determined according to the actual process capability;

S05: performing a model-based OPC correction on the correction target layer, and to obtain a mask layer.

Furthermore, a logical operation AND is performed on the shallow ion implanting region in the shallow ion implanting original layout and the active region pattern in the active area layer, to obtain the implanting active region.

Furthermore, the gap portion is completely fallen in the STI region.

Furthermore, the poly-silicon pattern in the poly-silicon layer is arranged in a strip shape, and the source-drain direction is vertical to an arrangement direction of the poly-silicon pattern in the poly-silicon layer; the poly-silicon contacting region is extended by X in a source-drain direction, to form the new poly-silicon contacting region.

Furthermore, the value of X ranges from 5 nm~200 nm.

Furthermore, the poly-silicon pattern in the poly-silicon layer is arranged in a strip shape, and the source-drain direction is vertical to an arrangement direction of the poly-silicon pattern in the poly-silicon layer; the poly-silicon contacting region is extended by Y in a direction vertical to the source-drain direction, to form the new poly-silicon contacting region.

Furthermore, the value of Y ranges from 5 nm~90 nm.

Furthermore, the non poly-silicon contacting region is extended by Z in a source-drain direction and in a direction vertical to the source-drain direction, to form the new poly-silicon contacting region.

Furthermore, the value of Z ranges from 5 nm~80 nm.

Furthermore, the value of G ranges from 100 nm~500 nm.

The beneficial effects of the present invention are as follows: the present invention can quickly and effectively eliminate the invalid pattern region of the shallow ion implanting layer, remain the necessary shallow ion implanting region pattern, simplify the difficulty of the pattern for OPC processing, and save the operation time, while the risk of causing the process problem due the invalid pattern is reduced.

BRIEF DESCRIPTION OF THE DRAWINGS

The OPC method and system for a shallow ion implanting layer of the present invention will be elucidated by reference to the following embodiments and the accompanying drawings, in which.

DETAILED DESCRIPTION OF THE EMBODIMENTS

In order to make the object, the technical solution and the advantage of the present invention clearer, the specific embodiments of the present invention are described in detail below in combination with drawings.

Figure 1:
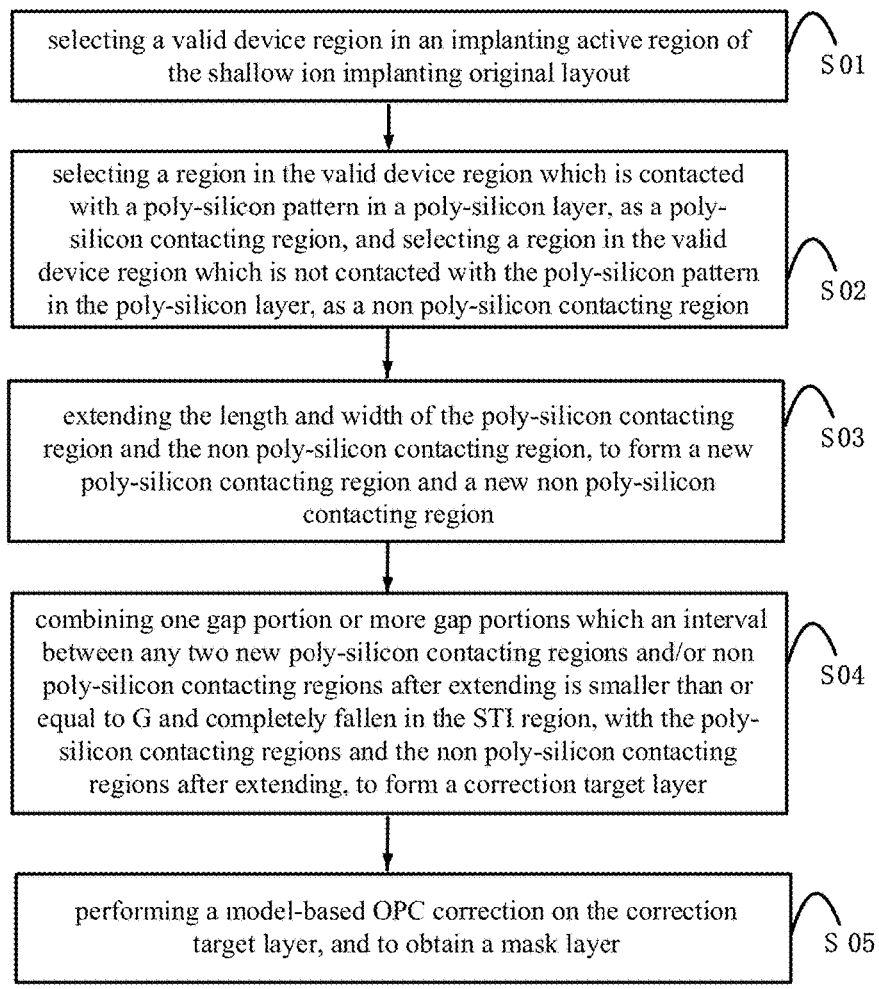
FIG. 1 is a schematic diagram of steps of an OPC method of a shallow ion implanting layer of the present invention.

As shown in FIG. 1, the present invention provides an OPC method for a shallow ion implanting layer, the shallow ion implanting layer is a shallow ion implanting original layout. The method comprises the following steps:

S01: selecting a valid device region in an implanting active region of the shallow ion implanting original layout.

Wherein a portion other than the active region pattern in the active area layer is a STI region, the shallow ion implanting original layout includes a shallow ion implanting region and a non-shallow ion implanting region, and a portion overlapped between the shallow ion implanting region and the active region pattern in the active area layer is the implanting active region.

Other layers corresponding to the shallow ion implanting original layout include an active area layer, a contact hole layer, a poly-silicon layer and so on, wherein the active area layer includes an active region pattern, the contact hole layer includes a contact hole pattern, and the poly-silicon layer includes a poly-silicon pattern.

The detailed operation includes the following steps of:

Firstly, the active region is divided into the shallow ion implanting region and the non-shallow ion implanting region, and a portion overlapped between the shallow ion implanting region and the active region pattern in the active area layer is the implanting active region.

A portion other than the active region pattern in the active area layer is the STI region. Specifically, a logical operation AND is performed on the active region pattern in the active area layer and the shallow ion implanting region in the shallow ion implanting original layout, to obtain the implanting active region located in the shallow ion implanting original layout.

Second, the implanting active region is divided into the valid device region and a non-device invalid region according to whether to touch with the contact hole pattern in the contact hole layer. Wherein a touch operation is performed on the implanting active region and the contact hole layer, to remain the implanting active region which touches to the contact hole pattern in the contact hole layer as the valid device region, and remain the implanting active region which does not touch to the contact hole pattern in the contact hole layer as the non-device invalid region.

S02: selecting a region in the valid device region which is contacted with the poly-silicon pattern in the poly-silicon layer, as a poly-silicon contacting region, and selecting a region in the valid device region which is not contacted with the poly-silicon pattern in the poly-silicon layer, as a non poly-silicon contacting region.

In some embodiments of the invention; the poly-silicon pattern in the poly-silicon layer is arranged in a strip shape, and the source-drain direction is defined to be vertical to an arrangement direction of the poly-silicon pattern.

S03: extending the length and width of the poly-silicon contacting region and the non poly-silicon contacting region, to form a new poly-silicon contacting region and a new non poly-silicon contacting region, wherein the new poly-silicon contacting region and the new non poly-silicon contacting region are located in any region except the active region pattern region touching with the contact hole pattern in the non-shallow ion implanting region.

Wherein the poly-silicon contacting region is extended by X in the source-drain direction, and/or, the poly-silicon contacting region is extended by Y in a direction vertical to the source-drain direction, to form the new poly-silicon contacting region.

Preferably, the value of X ranges from 5 nm~200 nm, the value of Y ranges from 5 nm~90 nm; the number of the new poly-silicon contacting regions may be M, there may be one gap or more gaps between the new poly-silicon contacting regions, and M is integer larger than or equal to 1.

The non poly-silicon contacting region is extended by Z to form a new non poly-silicon contacting region, and the value of Z ranges from 5 nm~80 nm.

This is corresponding to extend around by 5 nm~80 nm on the basis of the original non poly-silicon contacting region, to form a new non poly-silicon contacting regions.

The number of the new non poly-silicon contacting regions may be N, and there may be may be one gap or more gaps between the new non poly-silicon contacting regions, and N is integer larger than or equal to 1.

S04: combining the gap portion which the interval between any two poly-silicon contacting regions and/or non poly-silicon contacting regions after extending is smaller than or equal to G and completely fallen in the STI region, with the poly-silicon contacting regions and the non poly-silicon contacting regions after extending, to form a correction target layer, wherein G is an interval safe value determined according to the actual process capability.

In this step, the value of G ranges from 100 nm~500 nm, there may be a gap portion of the active region spaced between any two new poly-silicon contacting regions and/or new non poly-silicon contacting regions. When the value range of G is larger, the gap portion of the active region pattern sandwiched between two poly-silicon contacting regions and/or non poly-silicon contacting regions may be combined into the correction target layer. However, in the present invention, the gap portion of the active region pattern is not allowed to be combined into the correction target layer. Therefore, it is necessary to define that only the gap portion which is completely fallen into the STI region can be combined with the new poly-silicon contacting regions and the new non poly-silicon contacting regions, and to form the correction target layer.

In this step, the combination procedure may adopt the logical operation OR, that is, a region in which the interval between any two new poly-silicon contacting regions and/or new non poly-silicon contacting regions is smaller than or equal to G is selected, and a portion other than the valid device region in the region and all the new poly-silicon contacting regions and the non poly-silicon contacting regions are performed a logical operation OR and are combined, to form the correction target layer.

S05: performing a model-based OPC routine on the correction target layer, to obtain a mask layer.

The present invention is further explained by one specific embodiment below.

Embodiment One

Figure 2:
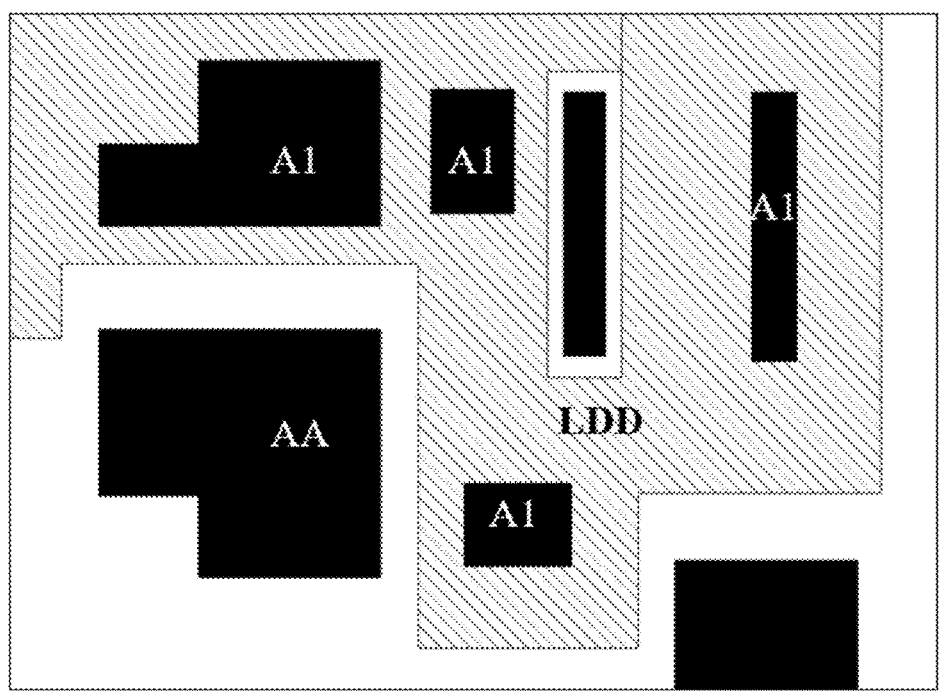
FIG. 2-7 are schematic diagrams of the shallow ion implanting original layout during the OPC method in embodiment one of the present invention.

As shown in FIGS. 2-7 which show an OPC method of a shallow ion implanting layer, other layers corresponding to a shallow ion implanting original layout include an active area layer, a contact hole layer and a poly-silicon layer, wherein the active area layer includes an active region pattern, the contact hole layer includes a contact hole pattern and the poly-silicon layer includes a ploy-silicon pattern. The method includes the following steps:

S01: as shown in FIG. 2, the shallow ion implanting original layout includes a shallow ion implanting region and a non-shallow ion implanting region, and a logical operation AND is performed on the active region pattern AA in the active area layer and the shallow ion implanting region LDD in the shallow ion implanting original layout, to obtain an implanting active region A1 located in the shallow ion implanting original layout, wherein a portion other than the active region pattern in the active area layer is a STI region.

Figure 3:
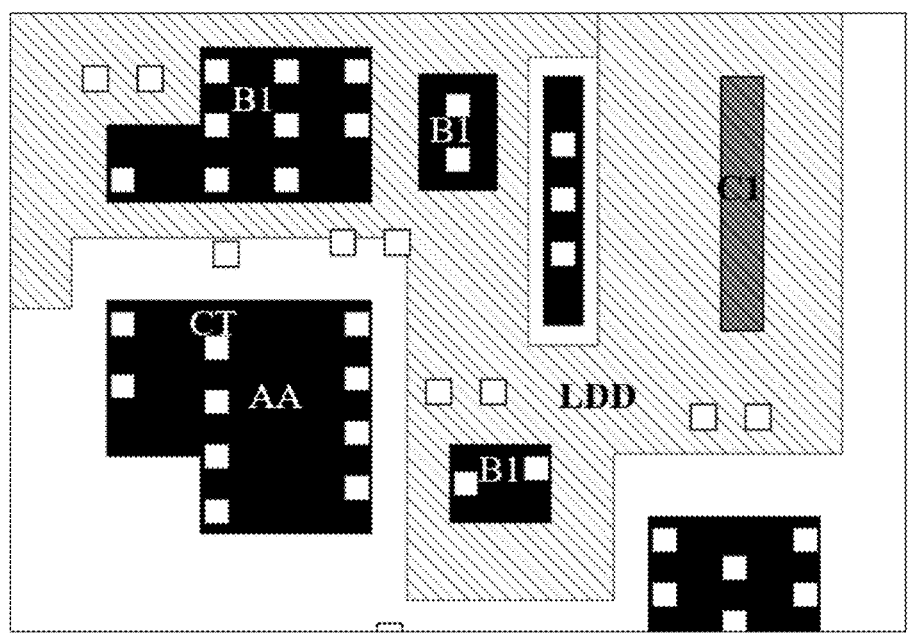

As shown in FIG. 3, performing a touch operation on the implanting active region A1 and the contact hole layer, to remain the implanting active region A1 which touches to the contact hole pattern CT in the contact hole layer as a valid device region B1, and remain the implanting active region A1 which does not touch to the contact hole pattern CT in the contact hole layer as a non-device invalid region C1.

Figure 4:
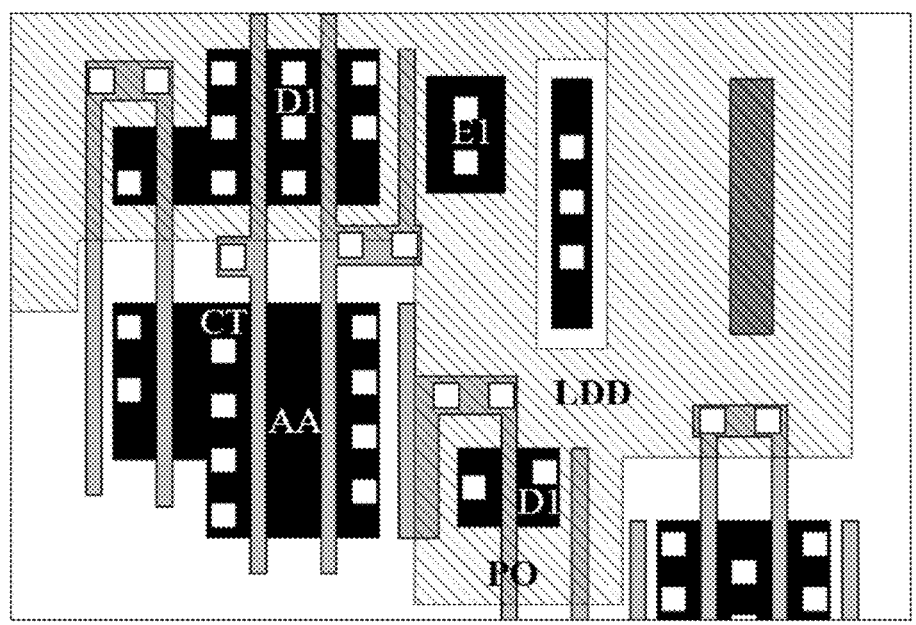

S02: as shown in FIG. 4, selecting a region in the valid device region B1 which is contacted with a poly-silicon pattern PO in a poly-silicon layer, as a poly-silicon contacting region D1, and selecting a region in the valid device region B1 which is not contacted with the poly-silicon pattern PO in the poly-silicon layer, as a non poly-silicon contacting region E1. The poly-silicon pattern PO in the poly-silicon layer is arranged in vertical, and the source-drain direction is defined to be vertical to an arrangement direction in a strip shape of the poly-silicon pattern, i.e., the horizontal direction.

Figure 5:
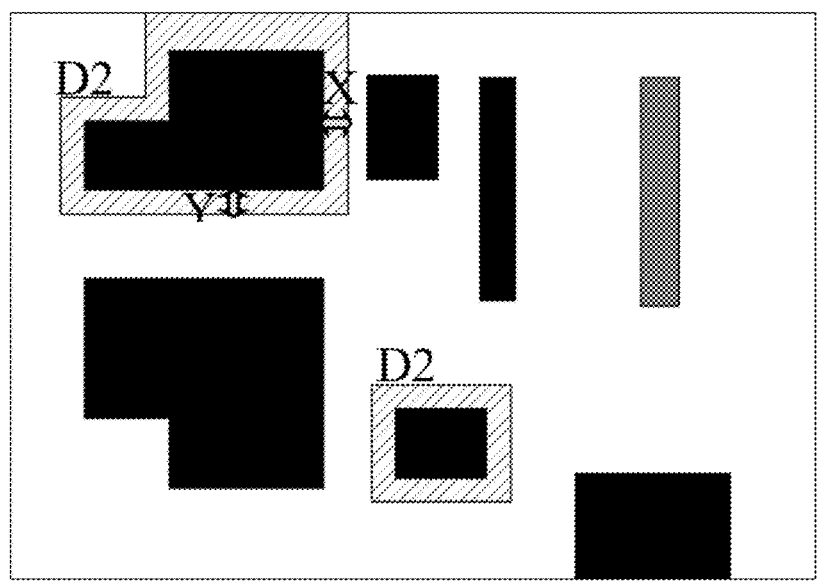

S03: as shown in FIG. 5, the length and width of the poly-silicon contacting region D1 is extended in the source-drain direction (i.e., the horizontal direction) by X which is 100 nm, and is extended in a direction vertical to the source-drain direction by Y which is 70 nm, to form the new poly-silicon contacting region and the new poly-silicon contacting region contain two separated poly-silicon contacting regions D2 between which there is a gap.

Figure 6:
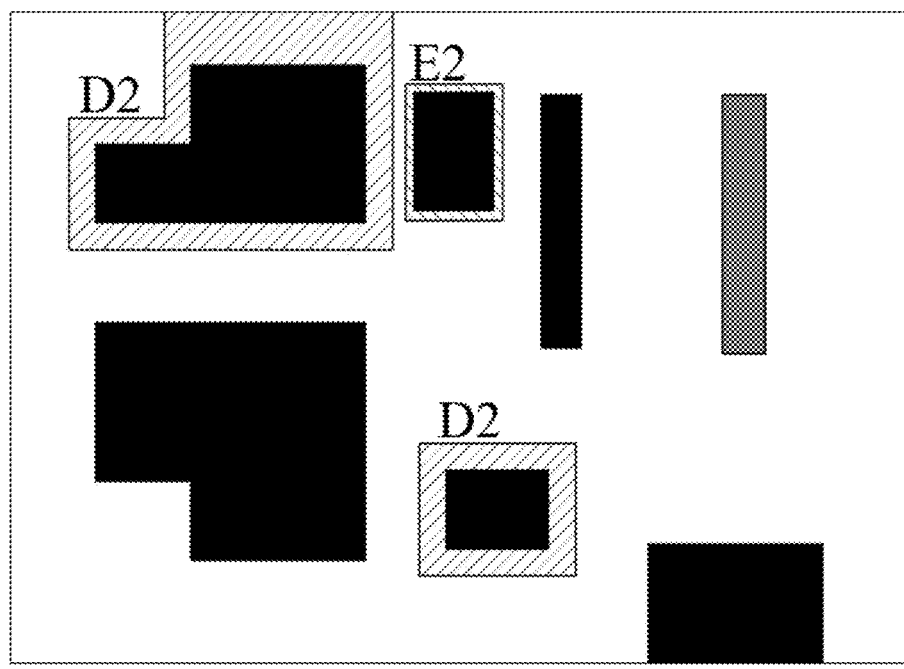

As shown in FIG. 6, the non poly-silicon contacting region E1 is extended by Z which is 60 nm, to form the new non poly-silicon contacting region E2, which corresponds to a case where on the basis of the original non poly-silicon contacting region, the length and width of the non poly-silicon contacting region is extended by 60 nm to form the new non poly-silicon contacting region E2, and the number of the new non poly-silicon contacting region E2 is only one.

Figure 7:
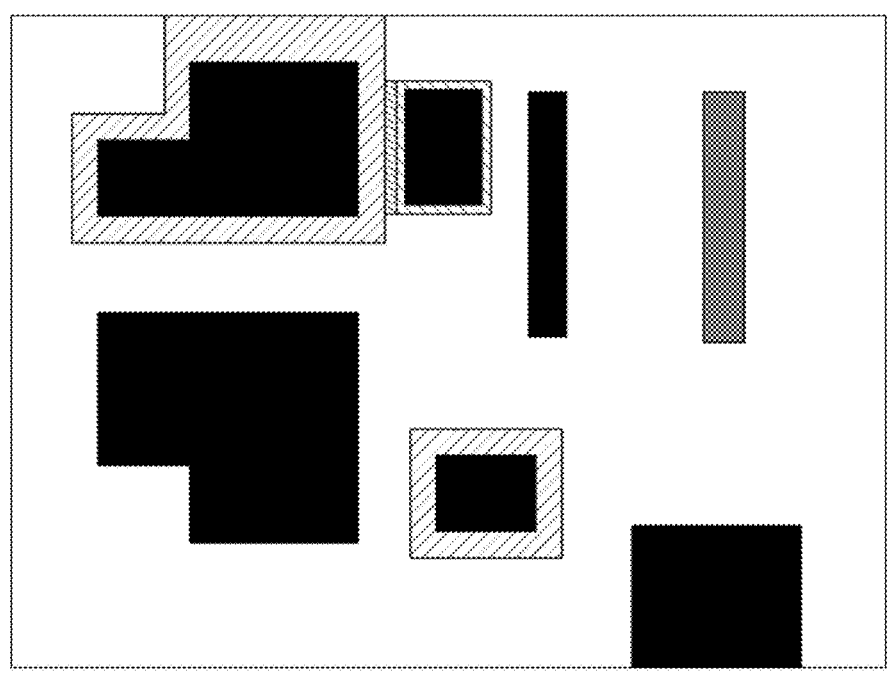

S04: as shown in FIG. 7, the interval between the two new poly-silicon contacting regions D2 is smaller than for example which is 200 nm, and the interval between two new poly-silicon contacting regions is filled, while the interval between the new non poly-silicon contacting region E2 and the new poly-silicon contacting region D2 is larger than and this interval is not processed, the filled portion is combined with the new poly-silicon contacting region D2 and the new non poly-silicon contacting region E2, to form the correction target layer.

S05: a model-based OPC routine is performed on the correction target layer, to obtain a mask layer.

By comparing the correction result of the OPC method of the present invention with the correction result of the conventional OPC method, it is found that, the number of the hot spots can be reduced from 13 to 1 by the method of the present invention compared with the conventional method, in the range of 5 μm*5 μm.

A portion which the interval between patterns is smaller than 160 nm is defined as the hot spot, and the existence of the hot spot will cause that the photoresist becomes narrow due to shrinkage after the subsequent exposure process, and the collapse of the photoresist and defects can occur very easily. Therefore, the present invention can quickly and effectively eliminate the invalid pattern region of the shallow ion implanting layer, remain the necessary pattern of the shallow ion implanting region, simplify the difficulty of the pattern for OPC processing, and save the operation time, while the risk of causing the process problem due to the invalid pattern is reduced.

The above is only the preferred embodiment of the present invention. Said embodiment is not intended to limit the patent protection scope of the present invention. Therefore, all the equivalent structural changes made using the contents of the specification and drawings of the present invention, should be encompassed in the protection scope of the present invention in a similar way.

The invention claimed is:

1. An OPC method for a shallow ion implanting layer, providing a shallow ion implanting original layout and other layers corresponding to the shallow ion implanting original layout include an active area layer, a contact hole layer and a poly-silicon layer, wherein the active area layer includes an active region pattern, the contact hole layer includes a contact hole pattern and the poly-silicon layer includes a ploy-silicon pattern; wherein the method comprising the following steps of:

S01: selecting a valid device region in an implanting active region of the shallow ion implanting original layout; wherein a portion other than an active region pattern in an active area layer is a STI region, the shallow ion implanting original layout includes a shallow ion implanting region and a non-shallow ion implanting region, and a portion overlapped between the shallow ion implanting region and the active region pattern in the active area layer is the implanting active region; a portion to remain the implanting active region which touches to the contact hole pattern in the contact hole layer is a valid device region, and anther portion to remain the implanting active region which does not touch to the contact hole pattern in the contact hole layer is a non-device invalid region;

S02: selecting a region in the valid device region which is contacted with a poly-silicon pattern in a poly-silicon layer, as a poly-silicon contacting region, and selecting a region in the valid device region which is not contacted with the poly-silicon pattern in the poly-silicon layer, as a non poly-silicon contacting region;

S03: extending the length and width of the poly-silicon contacting region and the non poly-silicon contacting region, to form a new poly-silicon contacting region and a new non poly-silicon contacting region; wherein the new poly-silicon contacting region and the new non poly-silicon contacting region are located in any region except the active region pattern touching with the contact hole pattern in the non-shallow ion implanting region;

S04: combining one gap portion or more gap portions which an interval between any two new poly-silicon contacting regions and/or new non poly-silicon contacting regions after extending is smaller than or equal to G, with the poly-silicon contacting regions and the non poly-silicon contacting regions after extending, to form a correction target layer, wherein G is an interval safe value determined according to the actual process capability;

S05: performing a model-based OPC correction on the correction target layer, and to obtain a mask layer.

2. The OPC method for the shallow ion implanting layer according to claim 1, wherein a logical operation AND is performed on the shallow ion implanting region in the shallow ion implanting original layout and the active region pattern in the active area layer, to obtain the implanting active region.

3. The OPC method of the shallow ion implanting layer according to claim 1, wherein the gap portion is completely fallen in the STI region.

4. The OPC method for the shallow ion implanting layer according to claim 1, wherein the poly-silicon pattern in the poly-silicon layer is arranged in a strip shape, and the source-drain direction is vertical to an arrangement direction of the poly-silicon pattern in the poly-silicon layer; the poly-silicon contacting region is extended by X in a source-drain direction, to form the new poly-silicon contacting region.

5. The OPC method for the shallow ion implanting layer according to claim 4, wherein the value of X ranges from 5 nm~200 nm.

6. The OPC method for the shallow ion implanting layer according to claim 1, wherein the poly-silicon pattern in the poly-silicon layer is arranged in a strip shape, and the source-drain direction is vertical to an arrangement direction of the poly-silicon pattern in the poly-silicon layer; the poly-silicon contacting region is extended by Y in a direction vertical to the source-drain direction, to form the new poly-silicon contacting region.

7. The OPC method for the shallow ion implanting layer according to claim 6, wherein the value of Y ranges from 5 nm~90 nm.

8. The OPC method for the shallow ion implanting layer according to claim 1, wherein the non poly-silicon contacting region is extended by Z in a source-drain direction and in a direction vertical to the source-drain direction, to form the new poly-silicon contacting region.

9. The OPC method for the shallow ion implanting layer according to claim 8, wherein the value of Z ranges from 5 nm~80 nm.

10. The OPC correction method of a shallow ion implanting layer according to claim 1, wherein the value of G ranges from 100 nm~500 nm.

* * * * *